United States Patent
Seong et al.

(10) Patent No.: US 7,485,897 B2
(45) Date of Patent: *Feb. 3, 2009

(54) NITRIDE-BASED LIGHT-EMITTING DEVICE HAVING GRID CELL LAYER

(75) Inventors: Tae-yeong Seong, Gwangju-si (KR);
Kyoung-kook Kim, Gyeonggi-do (KR);
June-o Song, Gwangju-si (KR);
Dong-seok Leem, Gwangju-si (KR)

(73) Assignees: Samsung Electronics Co., Ltd.,
Suwon-Si, Gyeonggi-Do (KR);
Gwangju Institute of Science and Technology, Buk-Gu, Gwangju-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/077,536

(22) Filed: Mar. 11, 2005

(65) Prior Publication Data

US 2005/0199895 A1    Sep. 15, 2005

(30) Foreign Application Priority Data

Mar. 12, 2004    (KR) .................. 10-2004-0017072

(51) Int. Cl.
*H01L 27/15*    (2006.01)
*H01L 31/12*    (2006.01)
*H01L 33/00*    (2006.01)

(52) U.S. Cl. .................. 257/81; 257/98; 257/99
(58) Field of Classification Search .................. 257/79,
257/82, 88, 90, 94, 98, 99, E33.64, E33.65, 257/81
See application file for complete search history.

(56) References Cited

U.S. PATENT DOCUMENTS 5,990,500 A * 11/1999 Okazaki .................. 257/99

(Continued)

FOREIGN PATENT DOCUMENTS

CN    1330415 A    1/2002

(Continued)

OTHER PUBLICATIONS

Mensz, P.M., et al., "$In_xGA_{1-x}N/Al_yGa_{1-y}N$ violet light emitting diodes with reflective p-contacts for high single sided light extraction", Electronics Letters, Nov. 20, 1997, pp. 2066-2068, vol. 33, No. 24, IEE, NY, USA and Stevenage, England.

(Continued)

*Primary Examiner*—Thien F Tran
(74) *Attorney, Agent, or Firm*—Buchanan Ingersoll & Rooney PC

(57)    ABSTRACT

A nitride-based light-emitting device and a method of manufacturing the same. The light-emitting device includes a substrate, and an n-cladding layer, an active layer, a p-cladding layer, a grid cell layer and an ohmic contact layer sequentially formed on the substrate. The grid cell layer has separated, conducting particle type cells with a size of less than 30 micrometers buried in the ohmic contact layer. The nitride-based light-emitting device and the method of manufacturing the same improve the characteristics of ohmic contact on the p-cladding layer, thereby increasing luminous efficiency and life span of the device while simplifying a manufacturing process by omitting an activation process after wafer growth.

12 Claims, 5 Drawing Sheets

U.S. PATENT DOCUMENTS 6,465,808 B2 * 10/2002 Lin .............................. 257/81
2005/0199888 A1 * 9/2005 Seong et al. .................. 257/79
2005/0218419 A1 * 10/2005 Okazaki et al. ............... 257/98

FOREIGN PATENT DOCUMENTS

EP 1168460 A2 1/2002
KR 2002-003101 1/2002

OTHER PUBLICATIONS

Korean Patent Office Notice to Submit Response, dated Dec. 15, 2005, and English translation thereof.

Office Action issued by Chinese Patent Office, dated Oct. 19, 2007, in counterpart Chinese Patent Application No. 2005100685404 and English-language translation thereof.

* cited by examiner

NITRIDE-BASED LIGHT-EMITTING DEVICE HAVING GRID CELL LAYER

CROSS-REFERENCE TO RELATED PATENT APPLICATION

This application claims the priority of Korean Patent Application No. 10-2004-0017072, filed on Mar. 12, 2004, in the Korean Intellectual Property Office, the disclosure of which is incorporated herein in its entirety by reference.

BACKGROUND OF THE INVENTION

1. Field of the Invention

Embodiments of the present invention relate to a nitride-based light-emitting device and a method of manufacturing the same, and more particularly, to a nitride-based light-emitting device with an electrode structure designed to improve luminous efficiency and a method of manufacturing the same.

2. Description of the Related Art

An ohmic contact between n- and p-electrodes is of great importance in realizing a light-emitting device such as a light-emitting diode (LED) or laser diode (LD) using a gallium nitride (GaN) semiconductor. In particular, an ohmic contact structure between a p-cladding layer and an electrode is essential to the performance of a nitride-based light-emitting device.

GaN-based LEDs are classified into top-emitting LEDs (TLEDs) and flip-chip LEDs (FCLEDs). Since in commonly used TLEDs, light exits through a p-ohmic electrode layer in contact with a p-cladding layer, the TLEDs require the p-ohmic electrode layer with high light transmittance, low specific contact resistivity, and low sheet resistance. Because light is emitted through a transparent insulating substrate in a FCLED design, a p-ohmic electrode layer in contact with a p-cladding layer must have high light reflectivity, low specific contact resistivity, and low sheet resistance.

However, due to an inverse relationship that most electrode materials have between optical and electrical characteristics and poor electrical characteristics such as low current injection and current spreading in a p-cladding layer, it is difficult to develop a p-ohmic electrode layer suitable for a TLED or FLED structure.

A metallic thin film structure including a transition metal such as nickel (Ni) as its main component, i.e., an oxidized semi-transparent nickel (Ni)/gold (Au) thin film, is now widely used to form a p-ohmic electrode layer in a top-emitting light-emitting device. It has been reported that the Ni-based metallic thin film is annealed in an oxygen ($O_2$) ambient to form a semi-transparent ohmic contact layer with specific contact resistivity of about $10^{-4}$ to $10^{-3}$ $\Omega cm^2$.

When the ohmic contact layer with low specific contact resistivity is annealed at temperature of 500 to 600° C. in an $O_2$ ambient, a nickel oxide (NiO) that is a p-type semiconductor oxide is formed on the island-like Au layer and between the Au layer and a p-GaN, thereby reducing a Schottky barrier height (SBH) at the interface between the p-GaN and Ni. Thus, holes that are majority carriers can be easily injected into the surface of the p-GaN, thereby increasing effective carrier concentration near the surface of the p-GaN. Furthermore, annealing of the Ni/Au ohmic contact to the p-GaN results in disassociation of a Mg-H complex in GaN, which reactivates Mg dopants by increasing their concentration on the surface of GaN. As a result of reactivation, effective carrier concentration increases above 10 weight percent on the surface of the p-GaN, which causes tunneling conductance between the p-GaN and the electrode layer (NiO) thus obtaining ohmic conductance characteristics.

Due to their low light utilization efficiency, TLEDs using an oxidized semi-transparent Ni/Au electrode film are not suited for realizing large-capacity, high brightness light-emitting devices.

Flip-chip light-emitting devices using a highly reflective electrode material like silver (Ag), aluminum (Al), or rhodium (Rh) have recently been developed to realize large-capacity, high-brightness light-emitting devices. While temporarily providing high luminous efficiency, use of the highly reflective material with a low work function makes it difficult to form a p-ohmic contact electrode with low specific ohmic contact resistivity and high thermal stability. Consequently, it is difficult to provide a long life span and high reliability of a light-emitting device.

For example, Al cannot be used for an ohmic contact because it tends to form a Schottky (non-ohmic) contact at the Al/p-GaN interface due to the low work function and strong tendency to form a nitride during annealing. A g can be used to form an ohmic contact to a p-GaN but suffers from thermal instability and a poor mechanical adhesion with the p-GaN, thus making it difficult to ensure reliability during manufacturing and operation of the light-emitting device. While providing a higher work function and thermal stability than Al and Ag, Rh has lower reflectivity and degrades ohmic characteristics during annealing.

A recently proposed approach to forming a good p-type transparent ohmic contact layer for a TLED is to directly or indirectly stack a transparent conducting oxide (TCO) such as indium tin oxide (ITO) on a p-cladding layer. However, this approach also suffers limitations such as a short life time and low reliability of the device due to the ohmic contact structure with high specific contact resistivity.

Mensz et al., in electronics letters 33 (24) pp. 2066, proposed Ni/A and Ni/Ag as a p-ohmic contact layer structure for a FLED. However, the proposed structure has the problem of low performance due to non-oxidation of Ni.

Furthermore, Michael R. Krames et al., in U.S. Patent Application Publication No. 2002/0171087 A1, disclosed p-electrodes, oxidized Ni/Ag and Au/$NiO_x$/Al. However, fabrication of the p-type reflective ohmic contact layer is complicated and the p-type reflective ohmic contact layer has a low luminous efficiency due to its high specific ohmic contact resistivity.

The formation of a high quality p-ohmic contact layer can also be of considerable importance for LDs. Unlike a LED requiring an electrode with both excellent electrical and optical characteristics, a LD needs an ohmic electrode with low ohmic resistance and high thermal stability and heat dissipation during its operation. However, with high specific contact resistivities and a large amount of heat generated during operation, many commonly-used ohmic electrodes for LDs degrade the life span and reliability of the device.

Meanwhile, in order to realize a high quality nitride-based light-emitting device, a high concentration p-type nitride-based semiconductor must be successfully grown.

Group II elements in the periodic table such as magnesium (Mg), zinc (Zn), and beryllium (Be) are commonly used as a dopant for a p-type nitride-based semiconductor. However, these metal dopants cannot serve their functions since they have a strong tendency to combine with hydrogen ($H_2$) and form various types of complexes, which causes passivation. Thus, activation is needed to debond $H_2$ from the complex so that the dopant can serve their function.

The most common activation technique is rapid thermal annealing (RTA) or furnace annealing at high temperature above 750° C. in a nitrogen ($N_2$) ambient for 3 minutes. Since a compensation effect by a large amount of $N_2$ vacancies formed on the surface of a p-type nitride-based semiconductor occurs during the activation, it is impossible to increase effective hole (major carrier) concentration on the p-type nitride-based semiconductor above $10^{18}/cm^2$. Furthermore, because the p-type nitride-based semiconductor has a sheet resistance of above $10^4 \ \Omega/cm^2$ due to its low hole concentration, it is difficult to form a good p-ohmic contact layer, thus hindering efficient hole injection and current spreading.

Furthermore, to achieve lower specific ohmic resistivity between a p-type semiconductor and an electrode, an electrode with a higher work function than the p-type semiconductor is needed. However, a p-type nitride-based semiconductor has the highest work function currently available.

Therefore, a p-type nitride-based ohmic electrode is fabricated by depositing a metal material such as Ni, Au, palladium (Pd), or platinum (Pt) in a single layer or multilayers and subsequently annealing the same to generate a large amount of Ga vacancies favorable for ohmic contact formation at an interface between the p-type nitride-based semiconductor and the electrode. However, the p-ohmic contact electrode thus fabricated has insufficient specific ohmic contact resistivity and optical characteristics to realize a high quality nitride-based light-emitting device.

OBJECTS AND SUMMARY

Embodiments of the present invention provide a nitride-based light-emitting device including an ohmic contact electrode with low sheet resistance and low specific ohmic contact resistivity and a method of manufacturing the same. Embodiments of the present invention also provide a nitride-based light-emitting device fabricated using a simple process that can prevent degradation of performance caused during thin film formation and a method of manufacturing the same.

According to an aspect of the present invention, there is provided a nitride-based light-emitting device having an active layer between n- and p-cladding layers, the device including: a grid cell layer formed on the p-cladding layer, the grid cell layer comprising separated particle type cells formed from a conducting material with a size of less than 30 micrometers; and an ohmic contact layer formed on the p-cladding layer and the grid cell layer.

The grid cell layer may be formed in at least one layer using at least one material selected from the group consisting of nickel (Ni), palladium (Pd), platinum (Pt), gold (Au), ruthenium (Ru), silver (Ag), titanium (Ti), manganese (Mn), cobalt (Co), copper (Cu), iridium (Ir), chrome (Cr), rhodium (Rh), scandium (Sc), zinc (Zn), cadmium (Cd), magnesium (Mg), beryllium (Be), lanthanide series of metals, and an alloy or solid solution containing at least one of the above metals. It may be formed to a thickness of less than 50 nanometers (nm).

The ohmic contact layer is a light-transmissive, transparent ohmic contact layer formed in at least one layer using at least one material selected from the group consisting of Ni, Pd, Pt, Au, Ag, Ru, Mn, Co, Cu, Ir, Cr, Rh, Sc, Zn, Cd, Mg, Be, lanthanide series of metals, an alloy or solid solution containing at least one of the above metals, a transparent conducting oxide (TCO), and a transparent conducting nitride (TCN).

Alternatively, the ohmic contact layer may be a reflective ohmic layer that can reflect incident light to the p-cladding layer and be formed in at least one layer using at least one material selected from the group consisting of Au, Ru, Cr, Rh, Sc, Zn, Mg, Ag, aluminum (Al), and an alloy or solid solution containing at least one of the above metals.

The nitride-based light-emitting device further includes an agglomeration preventing layer that is formed on the reflective ohmic contact layer and prevents damage to the reflective ohmic contact layer. It is made from at least one material selected from the group consisting of Cu, silicon (Si), germanium (Ge), Zn, Mg, Ti, tungsten (W), lithium (Li), and an alloy containing the above metals.

According to another aspect of the present invention, there is provided a method of manufacturing a nitride-based light-emitting device having an active layer between n- and p-cladding layers, the method including the steps of: (a) depositing a material for a grid cell layer on the p-cladding layer in a light-emitting structure including a substrate, and the n-cladding layer, the active layer, and the p-cladding layer sequentially formed on the substrate; (b) annealing the grid cell layer so that it is discretely separated into multiple particle type cells; and (c) forming an ohmic contact layer on the grid cell layer. Before the step (a), the method may further include depositing an n-electrode layer on an exposed n-cladding layer without performing annealing. The n-electrode layer is annealed in the step (b).

The annealing temperature may be sufficiently high to activate a dopant in the p-cladding layer. The annealing may be performed at 300 to 900° C. in a nitrogen, oxygen, or vacuum ambient.

In the step (a), the material for the grid cell layer is deposited to a thickness of 1 to 50 nm.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF THE PREFERRED EMBODIMENTS

A nitride-based light-emitting device and a method of fabricating the same according to preferred embodiments of the present invention will now be described more fully with reference to the accompanying drawings.

Figure 1:
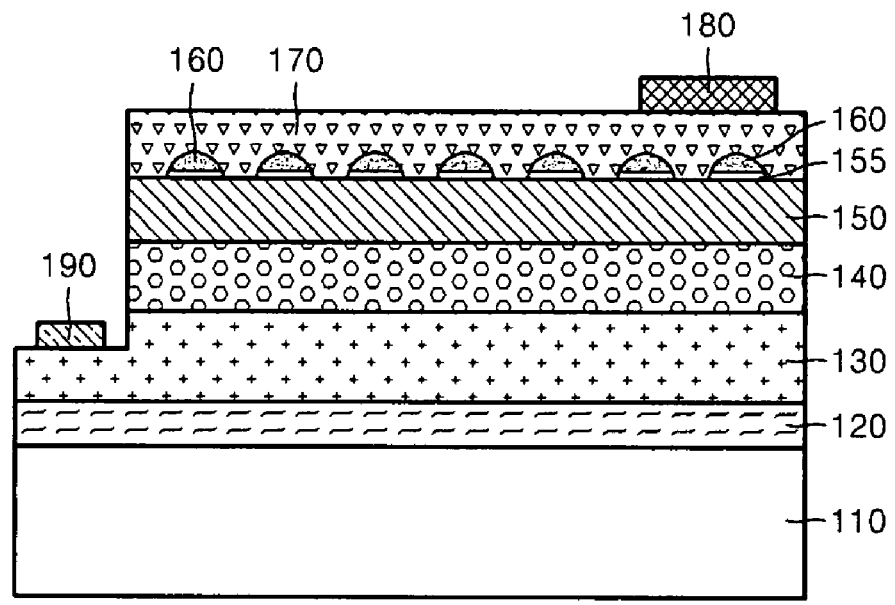
FIG. 1 is a cross-sectional view of a nitride-based light-emitting device according to a first embodiment of the present invention.

Referring to FIG. 1, a nitride-based light-emitting device according to a first embodiment of the present invention includes a substrate 110, and a buffer layer 120, an n-cladding layer 130, an active layer 140, a p-cladding layer 150, a grid cell layer 160 and a transparent ohmic contact layer 170 sequentially formed on the substrate 110. The nitride-based light-emitting device further includes a p-electrode pad 180 and an n-electrode pad 190.

The nitride-based light-emitting device is mainly divided into a light-emitting structure including the substrate 110, the buffer layer 120, the n-cladding layer 130, the active layer 140, and the p-cladding layer 150 and a p-electrode structure including the grid cell layer 160 and the transparent ohmic contact layer 170 formed on the p-cladding layer 150. The substrate 110 may be formed from sapphire ($Al_2O_3$), silicon carbide (SiC), Si, or gallium arsenide (GaAs). Optionally, the buffer layer 120 may not be formed.

Each of the layers from the buffer layer 120 up to the p-cladding layer 150 includes a compound selected from among III-nitride-based compounds represented by the general formula $Al_xIn_yGa_zN$ ($0 \leq x \leq 1$, $0 \leq y \leq 1$, $0 \leq z \leq 1$, and $0 \leq x+y+z \leq 1$) as its main component, and the n- and p-cladding layers 130 and 150 contain appropriate dopants in addition to the compounds. The active layer 140 may be formed as a single layer or a multiquantum well (MQW) layer, or have other commonly known structures.

For example, when each layer is mainly made from a GaN-based compound, the buffer layer 120 is made of GaN, the n-cladding layer 130 contains an n-type dopant such as Si, germanium (Ge), selenium (Se), or tellurium (Te) in addition to GaN, the active layer 140 has an indium gallium nitride (InGaN)/GaN MQW or aluminum gallium nitride (AlGaN)/GaN MQW structure, and the p-cladding layer 150 contains a p-type dopant such as magnesium (Mg), zinc (Zn), calcium (Ca), strontium (Sr), or barium (Ba) in addition to GaN.

An n-ohmic contact layer (not shown) may be interposed between the n-cladding layer 130 and the n-electrode pad 190 and composed of a titanium (Ti)/Al bilayer or other various known compositions. The p- and n-electrode pads 180 and 190 may be respectively composed of a nickel (Ni)/gold (Au), tungsten (W)/Au, platinum (Pt)/Au, palladium (Pd)/Au, or Ag/Au bilayer.

Each layer may be formed using commonly known deposition techniques such as an electron-beam (e-beam) evaporator, physical vapor deposition (PVD), chemical vapor deposition (CVD), pulsed laser deposition (PLD), dual-type thermal evaporator, or sputtering.

The grid cell layer 160 is made from a material that can increase effective carrier concentration in the p-cladding layer 150 and preferentially reacts with a component other than nitrogen (N) in a compound of the p-cladding layer 150. For example, in the case of a GaN-based light-emitting device, the grid cell layer 160 may be formed from a material that has high hydrogen affinity and preferentially reacts with Ga rather than N to form an intermetallic compound.

In this case, Ga vacancies are formed on the surface of the p-cladding layer including GaN as its main component by a reaction between Ga in the p-cladding layer 150 and the grid cell layer 160. Since the Ga vacancies act as a p-type dopant, effective p-type carrier concentration increases on the surface of the p-cladding layer 150 due to the reaction between the p-cladding layer 150 and the grid cell layer 160.

Furthermore, the grid cell layer 160 is made from a material having the ability to reduce a native oxide layer, gallium oxide ($Ga_2O_3$), which remains on the surface of the p-cladding layer 150 and acts as a barrier to prohibit the flow of carriers and the grid cell layer 160, so that Schottky barrier height and width decrease at the interface between the p-cladding layer 150 and the grid cell layer 160.

The grid cell layer 160 having the above-mentioned properties is used to cause more efficient activation, suppress the formation of nitrogen vacancies, create Ga vacancies as well as an inhomogeneous Schottky barrier, and reduce the native oxide layer on the surface of the p-GaN, thereby causing tunneling conductance at the interface between a GaN-based semiconductor and a metallic contact electrode.

To meet the above requirements, the grid cell layer 160 may be formed in a single layer or multilayers using a material selecting from the group consisting of one of Ni, Pd, Pt, Au, ruthenium (Ru), Ag, titanium (Ti), manganese (Mn), cobalt (Co), copper (Cu), iridium (Ir), chrome (Cr), rhodium (Rh), scandium (Sc), Zn, cadmium (Cd), Mg, beryllium (Be) and lanthanide series of metals and a metal, alloy or solid solution containing at least one of above metals.

The grid cell layer 160 comprises separated nano-sized particles obtained after performing rapid thermal annealing (RTA) on a material for the grid cell layer 160 deposited on the p-cladding layer 150.

The transparent ohmic contact layer 170 is used as an ohmic contact layer and made from a light transmissive material. More specifically, the transparent ohmic contact layer 170 is formed from a material selected from the group consisting of Ni, Pd, Pt, Au, Ru, Mn, Co, Cu, Ag, Ir, Cr, Rh, Sc, Zn, Cd, Mg, Be, lanthanide series of metals, and an alloy or solid solution containing at least one selected among the above metals. The transparent ohmic contact layer 170 may be formed in a single layer or multilayers.

Alternatively, the transparent ohmic contact layer 170 may be formed from a transparent conducting oxide (TCO) or a transparent conducting nitride (TCN). The TCO consists of oxygen (O) and at least one element selected from the group consisting of In, Sn, Zn, Ga, Cd, Mg, Be, Ag, Molybdenum (Mo), vanadium (V), Cu, Ir, Rh, Ru, W, Co, Ni, Mn, Al, and lanthanide series of metals. The TCN may be TiN containing Ti and N. The transparent ohmic contact layer 170 may also be formed to a thickness of 5 to 500 nanometers (nm).

Figure 2:
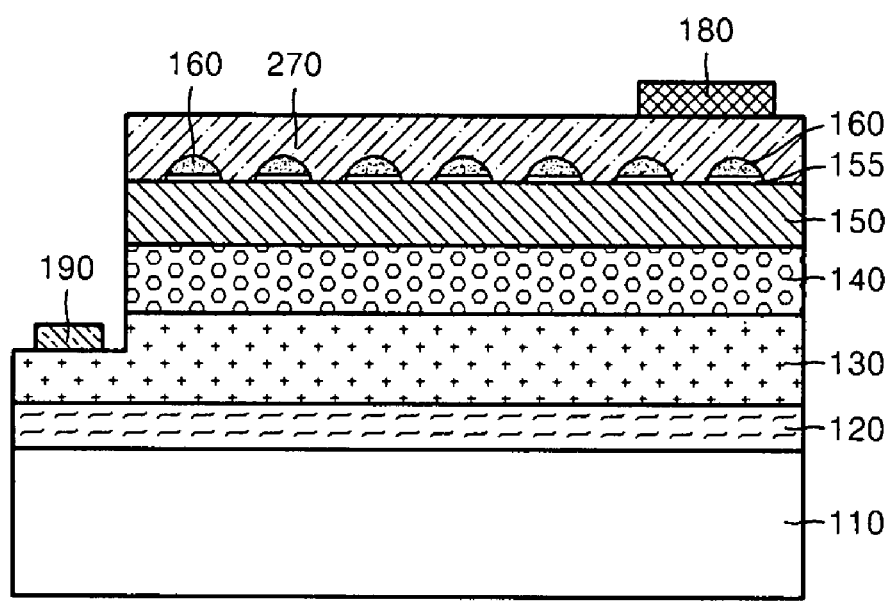
FIG. 2 is a cross-sectional view of a nitride-based light-emitting device according to a second embodiment of the present invention.

FIG. 2 is a cross-sectional view of a nitride-based light-emitting device according to a second embodiment of the present invention. Referring to FIG. 2, a reflective ohmic contact layer 270 is used as an ohmic contact layer to form a flip-chip structure. Like reference numerals in the drawings denote like elements.

The reflective ohmic contact layer 270 may be formed in a single layer or multilayers using Au, Ru, Cr, Rh, Sc, Zn, Mg, Ag, Al, or an alloy or solid solution containing at least one selected among the above metals. The reflective ohmic contact layer 270 may also be formed to a thickness of 10 to 1,000 nm.

Figure 3:
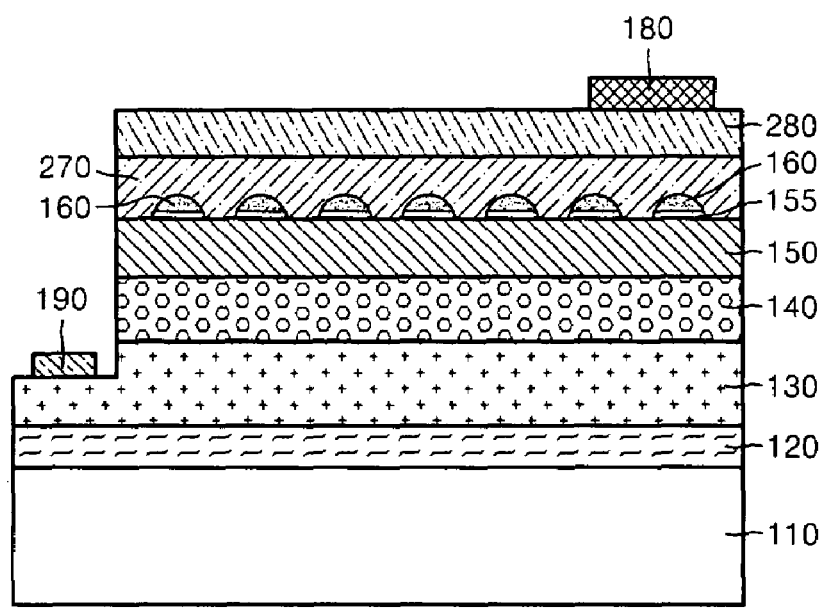
FIG. 3 is a cross-sectional view of a nitride-based light-emitting device according to a third embodiment of the present invention.

FIG. 3 is a cross-sectional view of a nitride-based light-emitting device according to a third embodiment of the present invention. Referring to FIG. 3, the nitride-based light-emitting device according to the third embodiment of the present invention further inicudes an agglomeration preventing layer (APL) 280 that is formed on the reflective ohmic contact layer 270 and prevents the damage to the reflective ohmic contact layer during subsequent annealing and during packaging that is the last step in the manufacturing process of the light emitting device.

The APL 280 is used to increase adhesion with a p-electrode pad 180 in the flip-chip light-emitting device and suppress oxidation of the reflective ohmic contact layer 270, thus improving durability. It may be formed to a thickness of 10 to 100 nm using at least one material selected from the group consisting of Cu, silicon (Si), germanium (Ge), Zn, Mg, Ti, W, lithium (Li), and an alloy containing at least one of the above metals.

The reflective ohmic contact layer 270 and the APL 280 are formed using one of an e-beam evaporator, a thermal evaporator, sputtering deposition, and PLD.

Figure 4:
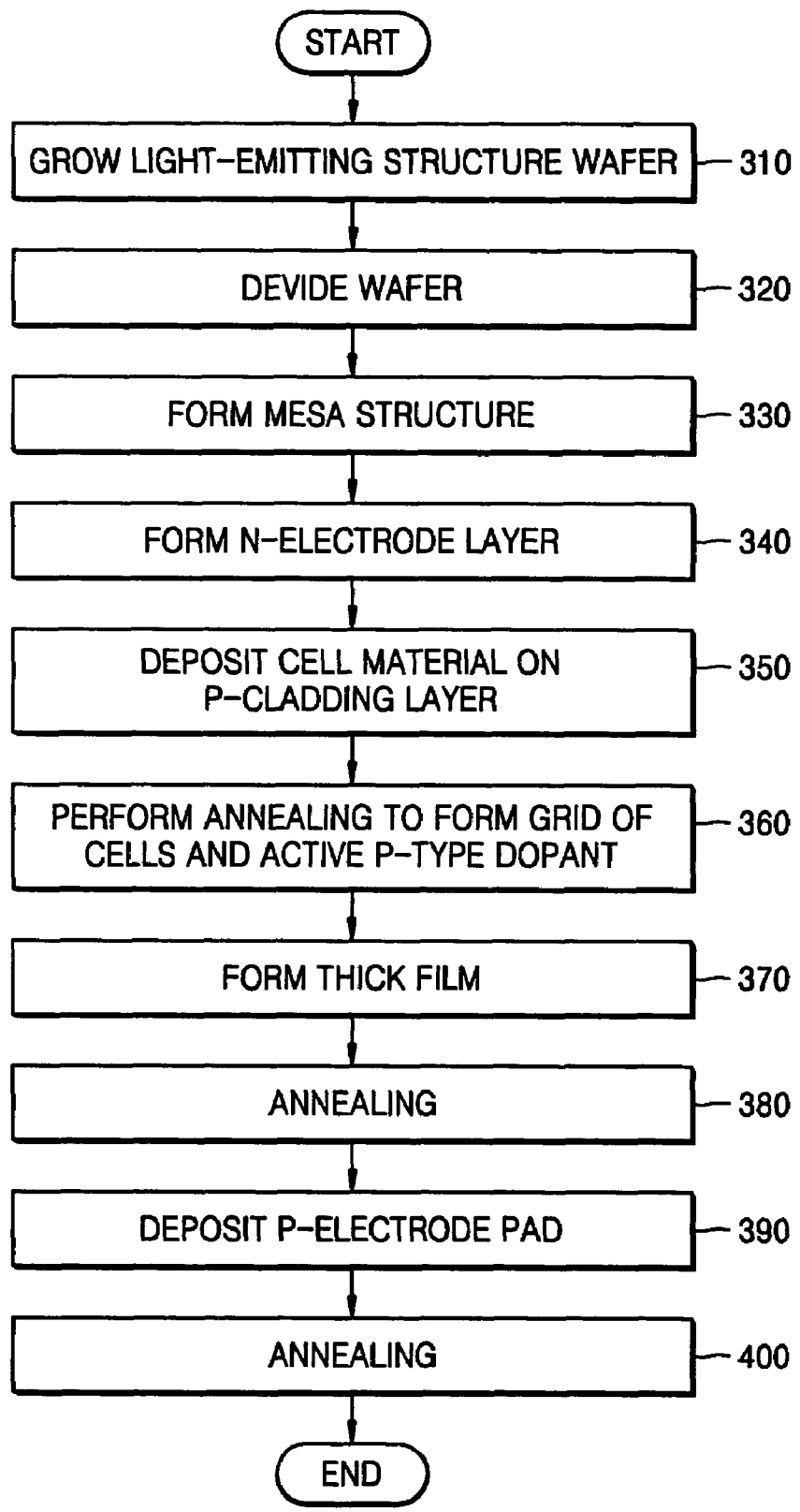
FIG. 4 is a flowchart illustrating a process of manufacturing a nitride-based light-emitting device according to an embodiment of the present invention.

A process of manufacturing a light-emitting device according to embodiments of the present invention will now be described with reference to FIGS. 1 through 4. Referring to FIG. 4, in step S310, a light emitting structure wafer on which the buffer layer 120, the n-cladding layer 130, the active layer 140, and the p-cladding layer 150 have been sequentially formed on the substrate 110 is grown. Then, in step S320, dry etching is performed to partition the light-emitting structure wafer into individual light-emitting structures of an appropriate size. In step S330, the individual light emitting structure is etched to expose a portion of the n-cladding layer 130, forming a MESA structure.

In step S340, the n-ohmic contact layer and the n-cladding electrode pad 190 are deposited over the MESA structure. In step S350, the material for the grid cell layer 160 described above is deposited on the p-cladding layer 150 to a thickness of 1 to 50 nm. The material may be deposited in a single layer or multilayers.

In step S360, annealing is performed to separate the grid cell layer 160 into particle type cells with a sub-micrometer or sub-nanometer size such that the cells are discretely distributed. The annealing temperature is sufficiently high to cause dopant activation during which a dopant in the p-cladding layer 150 grown in the step S310 is debonded from a dopant-hydrogen complex, to anneal the n-electrode layer deposited in the step S340, and to separate the grid cell layer 160 overlying the p-cladding layer 150 into discrete cells.

When annealing is performed at the sufficiently high temperature in the step S360, activation performed conventionally after the step S310 to activate the dopant in the p-cladding layer 150 and annealing conventionally performed after the step S340 to anneal the n-electrode layer can be omitted. The annealing temperature is appropriately selected within a temperature range from 300 to 900° C. depending on the type of material deposited. Annealing may be performed in $N_2$, $O_2$, or vacuum ambient for 30 seconds to 10 minutes using a rapid thermal process.

In steps S370 and S380, a thick film is formed and subsequently annealed. Here, the thick film refers to the ohmic contact layer 170 or 270 and the APL 280. Annealing is performed at a reactor temperature of 100 to 800° C. in a vacuum or gas ambient for 10 seconds to 3 hours. At least one of $N_2$, argon (Ar), helium (He), $O_2$, $H_2$, and air may be injected into the reactor during the annealing. In steps S390 and S400, the p-electrode pad 180 is deposited and subsequently annealed.

Figure 5A:
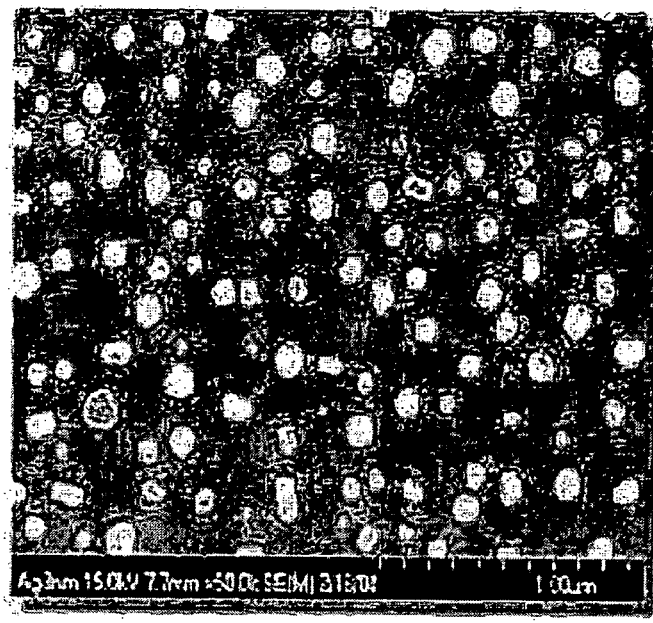
FIGS. 5A and 5B respectively shows scanning electron microscope (SEM) images of grid cell layers formed from silver (Ag) and gold (Au) particles according to a manufacturing method of the present invention.
Figure 5B:
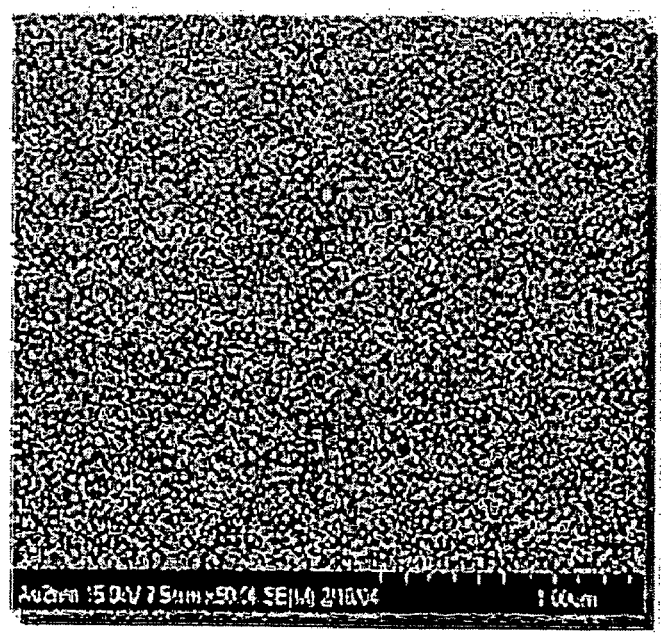

FIGS. 5A and 5B respectively show scanning electron microscope (SEM) images of grid cell layers formed according to the manufacturing method of the present invention. More specifically, FIG. 5A shows a SEM image of the grid cell layer 160 formed by depositing Ag on the p-cladding layer 150 to a thickness of 3 nm and performing RTA on the Ag particles at 600° C. in a $N_2$ ambient for 3 minutes. FIG. 5B shows a SEM image of the grid cell layer 160 formed by depositing Au on the p-cladding layer 150 to a thickness of 3 nm and performing RTA on the Au particles at 600° C. in a $N_2$ ambient for 3 minutes. It can be seen in FIGS. 5A and 5B that the grid cell layer 160 contains particle type cells with a sub-micrometer size although there is a little difference according to a material used to form the grid cell layer 160.

Figure 6:
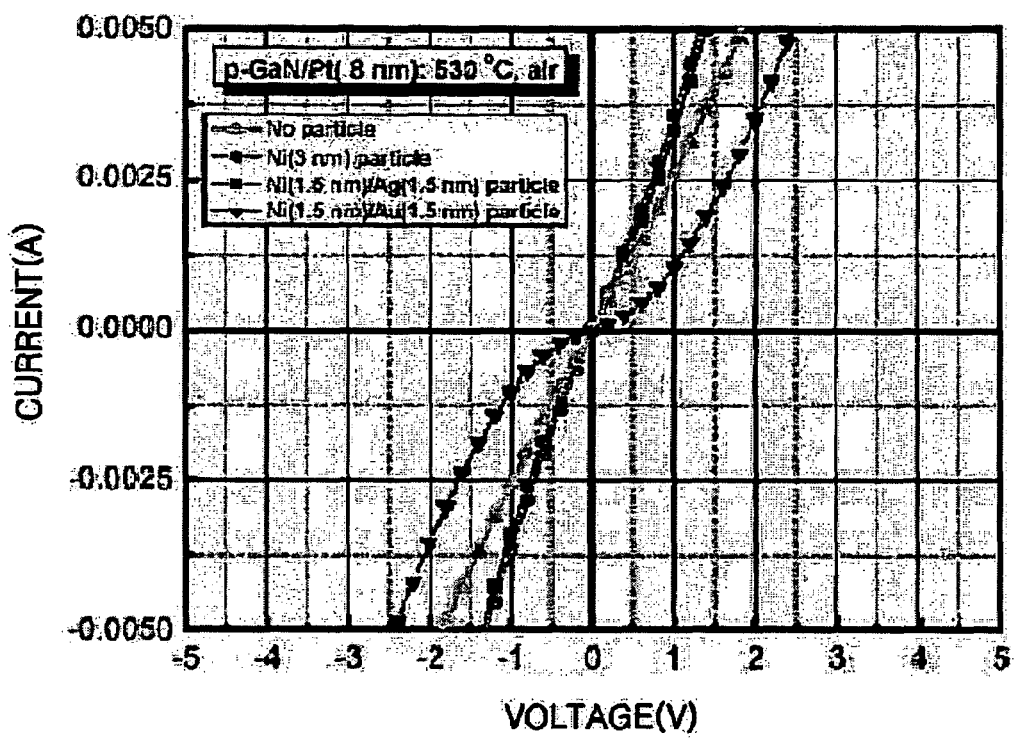
FIGS. 6 and 7 are graphs illustrating current-voltage (I-V) characteristics measured on a light-emitting diode (LED) with a grid cell layer of a different material according to the present invention and a LED without the grid cell layer.
Figure 7:
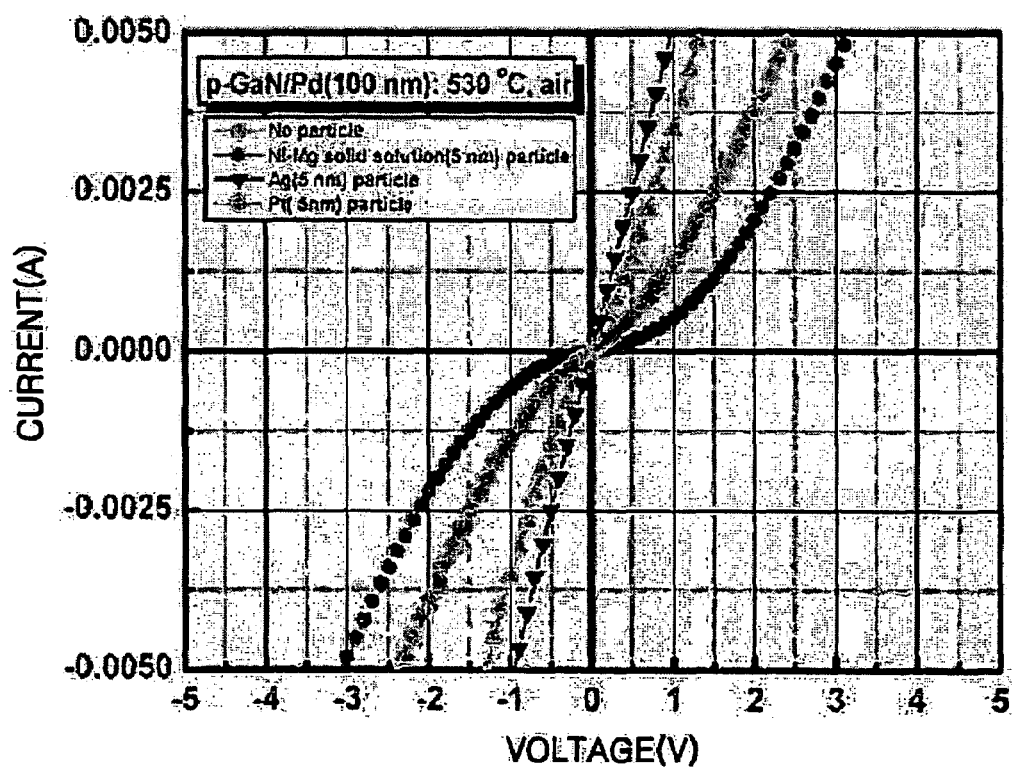

FIGS. 6 and 7 illustrate experimental results to identify electrical characteristics of a light emitting device having the above configuration. FIG. 6 illustrates current-voltage (I-V) characteristics measurements of four top-emitting light-emitting devices with either (1) no grid cell layer 160 but a light-transmissive, 8-nm-thick Pt layer formed on the p-GaN-based cladding layer 150; (2) a grid cell layer 160 formed by depositing Ni to a thickness of 3 nm and annealing the same and a subsequent 8-nm-thick Pt layer; (3) a grid cell layer 160 formed by sequentially depositing Ni (1.5 nm) and Ag (1.5 nm) and annealing the same and a subsequent 8-nm-thick Pt layer; or (4) a grid cell layer 160 formed by sequentially depositing Ni (1.5 nm) and Au (1.5 nm) and annealing the same and a subsequent 8-nm-thick Pt layer. As evident from FIGS. 6 and 7, the light-emitting device where the grid cell layer 160 made of Ni or Ni/Ag is formed between the p-cladding layer 150 and the 8-nm-thick Pt layer has superior electrical characteristics over the light-emitting device where the 8-nm-thick Pt layer is formed immediately on the p-cladding layer 150.

FIG. 7 illustrates I-V characteristics measurements of four electrode structures for a laser diode (LD) with either (1) no grid cell layer 160 but a subsequent 100-nm-thick Pd layer formed on the p-GaN-based cladding layer 150; (2) a grid cell layer 160 formed by depositing a Ni—Mg solid solution alloy to a thickness of 5 nm and annealing the same and a subsequent 100-nm-thick Pd layer; (3) a grid cell layer 160 formed by depositing Ag to a thickness of 5 nm and annealing the same and a subsequent 100-nm-thick Pd layer; or (4) a grid cell layer 160 formed by depositing Pt to a thickness of 5 nm and annealing the same and a subsequent 100-nm-thick Pd layer. As evident from FIG. 7, the electrode structure with the grid cell layer 160 made of Ag exhibits superior electrical characteristics over that without the grid cell layer 160.

As described above, a nitride-based light-emitting device and a method of manufacturing the same improve the characteristics of ohmic contact on the p-cladding layer, thereby increasing luminous efficiency and life span of the device while simplifying a manufacturing process by omitting an activation process after wafer growth.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nitride-based light-emitting device having an active layer between n- and p-cladding layers, the device comprising:
    a grid cell layer formed on the p-cladding layer, wherein the p-cladding layer is an activated layer, the grid cell layer containing separated particle type cells formed from a conducting material with a size of less than 30 micrometers; and
    an ohmic contact layer formed on the p-cladding layer and the grid cell layer, wherein the grid cell layer is formed in at least one layer using at least one material selected from the group consisting of ruthenium, cadmium, lanthanide series of metals, an alloy containing at least one of the above metals, and a solid solution containing at least one of the above metals.

2. The device of claim 1, wherein the grid cell layer is formed to a thickness of less than 50 nanometers.

3. The device of claim 1, wherein the ohmic contact layer is a light-transmissive, transparent ohmic contact layer formed in at least one layer using at least one material selected from the group consisting of nickel, palladium, platinum, gold, silver, ruthenium, manganese, cobalt, copper, iridium, chrome, rhodium, scandium, zinc, cadmium, magnesium, beryllium, lanthanide series of metals, an alloy containing at least one of the above metals, a solid solution containing at least one of the above metals, a transparent conducting oxide, and a transparent conducting nitride.

4. The device of claim 3, wherein the transparent conducting oxide consists of oxygen and at least one element selected from the group consisting of indium, tin, zinc, gallium, cadmium, magnesium, beryllium, silver, molybdenum, vanadium, copper, iridium, rhodium, ruthenium, tungsten, cobalt, nickel, manganese, aluminum, and lanthanide series of metals, and wherein the transparent conducting nitride contains titanium and nitrogen.

5. The device of claim 1, wherein the ohmic contact layer is a reflective ohmic layer that can reflect incident light to the p-cladding layer and is formed in at least one layer using at least one material selected from the group consisting of gold, ruthenium, chrome, rhodium, scandium, zinc, magnesium, silver, aluminum, an alloy containing at least one of the above metals, and a solid solution containing at least one of the above metals.

6. The device of claim 5, further comprising an agglomeration preventing layer that is formed on the reflective ohmic contact layer and prevents damage to the reflective ohmic contact layer,
    wherein the agglomeration preventing layer is made from at least one material selected from the group consisting of copper, silicon, germanium, zinc, magnesium, titanium, tungsten, lithium, and an alloy containing at least one of the above metals.

7. A nitride-based light-emitting device having an active layer between n- and p-cladding layers, the device comprising:
    a grid cell layer formed on the p-cladding layer, wherein the p-cladding layer is an activated layer, wherein the p-cladding layer is annealed at a temperature sufficiently high to cause dopant activation during which dopant in the p-cladding layer is debonded from a dopant-hydrogen complex, the grid cell layer containing separated particle type cells formed from a conducting material with a size of less than 30 micrometers; and
    an ohmic contact layer formed on the p-cladding layer and the grid cell layer, wherein the grid cell layer is formed in at least one layer using at least one material selected from the group consisting of ruthenium, cadmium, lanthanide series of metals, an alloy containing at least one of the above metals, and a solid solution containing at least one of the above metals.

8. The device of claim 7, wherein the grid cell layer is formed to a thickness of less than 50 nanometers.

9. The device of claim 7, wherein the ohmic contact layer is a light-transmissive, transparent ohmic contact layer formed in at least one layer using at least one material selected from the group consisting of nickel, palladium, platinum, gold, silver, ruthenium, manganese, cobalt, copper, iridium, chrome, rhodium, scandium, zinc, cadmium, magnesium, beryllium, lanthanide series of metals, an alloy containing at least one of the above metals, a solid solution containing at least one of the above metals, a transparent conducting oxide, and a transparent conducting nitride.

10. The device of claim 9, wherein the transparent conducting oxide consists of oxygen and at least one element selected from the group consisting of indium, tin, zinc, gallium, cadmium, magnesium, beryllium, silver, molybdenum, vanadium, copper, iridium, rhodium, ruthenium, tungsten, cobalt, nickel, manganese, aluminum, and lanthanide series of metals, and wherein the transparent conducting nitride contains titanium and nitrogen.

11. The device of claim 7, wherein the ohmic contact layer is a reflective ohmic layer that can reflect incident light to the p-cladding layer and is formed in at least one layer using at least one material selected from the group consisting of gold, ruthenium, chrome, rhodium, scandium, zinc, magnesium, silver, aluminum, an alloy containing at least one of the above metals, and a solid solution containing at least one of the above metals.

12. The device of claim 11, further comprising an agglomeration preventing layer that is formed on the reflective ohmic contact layer and prevents damage to the reflective ohmic contact layer,
    wherein the agglomeration preventing layer is made from at least one material selected from the group consisting of copper, silicon, germanium, zinc, magnesium, titanium, tungsten, lithium, and an alloy containing at least one of the above metals.

* * * * *